(12) United States Patent
Nakamura

(10) Patent No.: US 8,507,891 B2
(45) Date of Patent: Aug. 13, 2013

(54) GROUP III NITRIDE SEMICONDUCTOR LIGHT-EMITTING DEVICE AND PRODUCTION METHOD THEREFOR

(75) Inventor: Ryo Nakamura, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 11 days.

(21) Appl. No.: 13/367,263

(22) Filed: Feb. 6, 2012

(65) Prior Publication Data

US 2012/0205618 A1    Aug. 16, 2012

(30) Foreign Application Priority Data

Feb. 11, 2011    (JP) .................... 2011-027980

(51) Int. Cl.
*H01L 31/00*    (2006.01)

(52) U.S. Cl.
USPC .............. 257/13; 257/E33.008; 257/E33.023; 438/48

(58) Field of Classification Search
USPC ................. 257/13, E33.008, E33.02; 438/48
See application file for complete search history.

(56) References Cited

U.S. PATENT DOCUMENTS

2007/0057249 A1*    3/2007    Kim et al. .................... 257/14

FOREIGN PATENT DOCUMENTS

| JP | 11-220169 A | 8/1999 |
| JP | 2007-180495 A | 7/2007 |
| JP | 2007-201424 | 8/2007 |

* cited by examiner

*Primary Examiner* — Jami M Valentine
(74) *Attorney, Agent, or Firm* — McGinn IP Law Group, PLLC

(57) ABSTRACT

The present invention provides a Group III nitride semiconductor light-emitting device exhibiting improved emission performance and high electrostatic breakdown voltage. The Group III nitride semiconductor light-emitting device has a layered structure in which an n-type contact layer, an ESD layer, an n-type cladding layer, a light-emitting layer, a p-type cladding layer, and a p-type contact layer are deposited on a sapphire substrate. The ESD layer has a pit. The n-type cladding layer and the light-emitting layer are formed without burying the pit. The pit has a diameter of 110 nm to 150 nm at an interface between the n-type cladding layer and the light-emitting layer. The barrier layer of the light-emitting layer is formed of AlGaN having an Al composition ratio of 3% to 7%.

8 Claims, 3 Drawing Sheets

GROUP III NITRIDE SEMICONDUCTOR LIGHT-EMITTING DEVICE AND PRODUCTION METHOD THEREFOR

BACKGROUND OF THE INVENTION

1. Field of the Invention

The present invention relates to a Group III nitride semiconductor light-emitting device exhibiting improved emission performance and high electrostatic breakdown voltage due to strain relaxation in a light-emitting layer by forming a pit on an n-type layer, wherein AlGaN is used as a barrier layer of the light-emitting layer.

2. Background Art

As a Group III nitride semiconductor light-emitting device, a structure has been known in which a pit is formed on an n-type layer, and a light-emitting layer is formed without burying the pit.

For example, Japanese Patent Application Laid-Open (kokai) No. 2007-180495 discloses that an ESD layer comprising two layers: i-GaN layer and n-GaN layer, is provided on an n contact layer, a pit is formed on the i-GaN layer, and Si concentration and film thickness of the n-GaN layer are controlled to fall within a specified range, thereby high electrostatic breakdown voltage is attained. It is also disclosed that a light-emitting layer has a MQW structure in which AlGaN is used as a barrier layer.

Japanese Patent Application Laid-Open (kokai) No. 2007-201424 discloses a Group III nitride semiconductor light-emitting device wherein an intermediate layer having a pit with a top diameter of 0.05 μm or more is formed on an n-type layer, and a light-emitting layer is formed thereon without burying the pit, thereby suppressing the reverse current when current flows. It is also disclosed that the light-emitting layer has a MQW structure in which GaN and InGaN are alternately deposited.

Japanese Patent Application Laid-Open (kokai) No. 1999-220169 describes that a layer having a pit is formed between a growth substrate and a light-emitting layer, thereby relaxing the strain in the light-emitting layer and improving emission performance.

Attempts have been made to improve emission performance by using AlGaN as a barrier layer so that the electrons are more efficiently confined in a light-emitting layer having a MQW structure of Group III nitride semiconductor light-emitting device. However, when a pit is formed on an n-type layer and AlGaN is used as a barrier layer of the light-emitting layer, there is the following problem. When the pit diameter is excessively small, the strain in the light-emitting layer is not sufficiently relaxed, resulting in the reduction of light output. On the other hand, when the pit diameter is excessively large, the carriers are not sufficiently confined, resulting in the reduction of emission performance.

Japanese Patent Application Laid-Open (kokai) No. 2007-180495 discloses that AlGaN is used as a barrier layer of a light-emitting layer, but there is no consideration for the pit diameter. In Japanese Patent Application Laid-Open (kokai) No. 2007-201424, the pit diameter is examined when GaN is used as a barrier layer of a light-emitting layer, but there is no mention of the pit diameter when AlGaN is used.

SUMMARY OF THE INVENTION

In view of the foregoing, an object of the present invention is to improve emission performance by relaxing the strain and increasing the confinement rate of the carriers in a light-emitting layer while attaining high electrostatic breakdown voltage in a Group III nitride semiconductor light-emitting device wherein a pit is formed on an n-type layer and AlGaN is used as a barrier layer of a light-emitting layer having a MQW structure.

In a first aspect of the present invention, there is provided a Group III nitride semiconductor light-emitting device, the device comprising an n-type layer, a light-emitting layer, and a p-type layer, which are sequentially deposited, the n-type layer having a pit, wherein the pit diameter is 110 nm to 150 nm at an interface between the light-emitting layer and the n-type layer, and the light-emitting layer has a MQW structure in which an AlGaN barrier layer and an InGaN well layer are alternately deposited.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 element (i.e., B or Tl), or a portion of N is substituted by another Group 15 element (i.e., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

The pit diameter at the interface between the light-emitting layer and the n-type layer can be controlled by the growth temperature of the Group III nitride semiconductor layer when a pit is formed. For example, when the growth temperature is controlled between 850° C. and 920° C., the pit diameter is 110 nm to 150 nm.

Preferably, the barrier layer has an Al composition ratio of 3 mol % to 7 mol % to AlGa. That is, when the semiconductor of the barrier layer is described as $Al_xGa_{1-x}N$, x is any value in the range from 0.03 to 0.07. This enhances the confinement of the carriers in the light-emitting layer and reduces overflow, thereby improving emission performance.

A second aspect of the present invention is drawn to a specific embodiment of the Group III nitride semiconductor light-emitting device according to the first aspect, wherein the barrier layer has an Al composition ratio of 3 mol % to 7 mol % to AlGa, i.e., x of $Al_xGa_{1-x}N$ is 0.03 to 0.07.

A third aspect of the present invention is drawn to a specific embodiment of the Group III nitride semiconductor light-emitting device according to the first or second aspect, wherein the n-type layer has a structure in which an n-type contact layer, an ESD layer, and an n-type cladding layer are sequentially deposited; the pit is formed in and from the ESD layer; and the n-type cladding layer and the light-emitting layer are formed without burying the pit.

In a fourth aspect of the present invention, there is provided a method for producing a Group III nitride semiconductor light-emitting device comprising an n-type layer, a light-emitting layer, and a p-type layer which are sequentially deposited, the n-type layer having a pit, wherein the pit is formed at a growth temperature of 850° C. to 920° C., the light-emitting layer is formed by repeatedly depositing an AlGaN barrier layer and an InGaN well layer.

The present invention can improve emission performance by controlling the strain in the light-emitting layer or the confinement of the carriers while attaining high electrostatic breakdown voltage.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
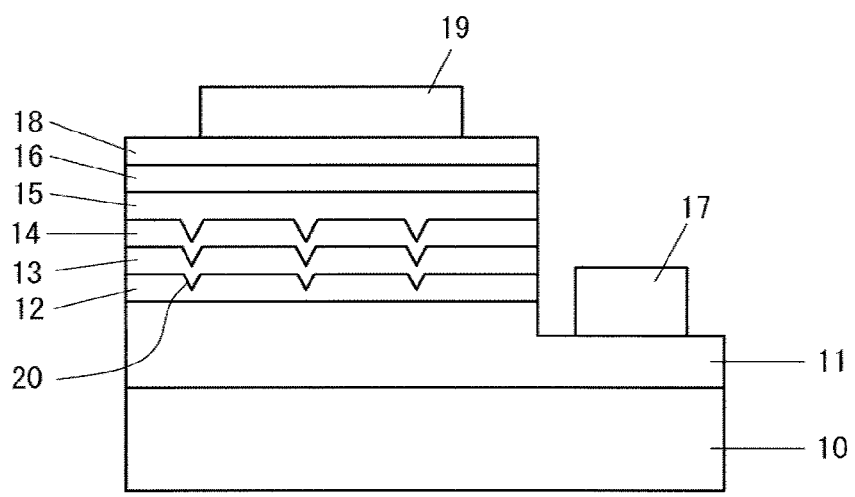
FIG. 1 shows the configuration of a Group III nitride semiconductor light-emitting device according to Embodiment 1.

FIG. 1 shows the configuration of a Group III nitride semiconductor light-emitting device according to Embodiment 1. The Group III nitride semiconductor light-emitting device has a sapphire substrate 10 on which an n-type contact layer 11, an ESD layer 12, an n-type cladding layer 13, a light-emitting layer 14, a p-type cladding layer 15, and a p-type contact layer 16 are sequentially deposited via a buffer layer (not illustrated). A trench with a depth reaching the surface of the n-type contact layer 11 is formed on a portion of the p-type contact layer 16, and an n electrode 17 is formed on the surface of the n-type contact layer exposed by the trench. An ITO transparent electrode 18 is formed on almost the entire surface of the p-type contact layer 16, and a p electrode 19 is formed on the transparent electrode 18.

A texture including at least one of a dot pattern and a stripe pattern may be formed on the sapphire substrate 10 to improve light extraction efficiency. The growth substrate may be formed of, for example, SiC, ZnO, Si, or GaN other than sapphire.

The n-type contact layer 11 is formed of n-GaN doped with Si at high concentration. To make a good contact with the n electrode 17, the n-type contact layer 11 may comprise multiple layers with different carrier concentrations.

The ESD layer 12 is a layer to improve electrostatic breakdown voltage or light output due to strain relaxation in the light-emitting layer by forming a pit 20. The ESD layer 12 may comprise, for example, three layers: a first ESD layer, a second ESD layer, and a third ESD layer which are sequentially deposited on the n-type contact layer 11. The first ESD layer is formed of n-GaN doped with Si at a concentration of $1 \times 10^{16}/cm^3$ to $5 \times 10^{17}/cm^3$. The first ESD layer has a thickness of 200 nm to 1000 nm. A pit formed on the surface of the first ESD layer has a density of $1 \times 10^8/cm^2$ or less. The second ESD layer is formed of non-doped GaN. The second ESD layer has a thickness of 50 nm to 200 nm. A pit formed on the surface of the second ESD layer has a density of $2 \times 10^8/cm^2$ or more. Although the second ESD layer is non-doped, it has a carrier density of $1 \times 10^{16}/cm^3$ to $1 \times 10^{17}/cm^3$ due to remaining carrier. The third ESD layer is GaN doped with Si, and the characteristic value defined as a product of Si concentration (/cm$^3$) and film thickness (nm) is $0.9 \times 10^{20}$ nm/cm$^3$ to $3.6 \times 10^{20}$ nm/cm$^3$. For example, when the thickness of the third ESD layer is 30 nm, the Si concentration is $3.0 \times 10^{18}/cm^3$ to $1.2 \times 10^{19}/cm^3$. The n-type cladding layer 13 and the light-emitting layer 14 are formed along the shape of the pit without burying the pit formed on the ESD layer 12.

The n-type cladding layer 13 has a superlattice structure in which InGaN and GaN are alternately deposited fifteen times. On the surface of the n-type cladding layer 13 (an interface between the n-type cladding layer 13 and the light-emitting layer 14), the pit 20 has a diameter of 110 nm to 150 nm.

The light-emitting layer 14 has a MQW structure in which the AlGaN barrier layer and the InGaN well layer are alternately deposited five times. The Al composition ratio of the barrier layer is 3 mol % to 7 mol % to AlGa. That is, when the semiconductor of the barrier layer is described as x is any value in the range from 0.03 to 0.07. The In composition ratio of the well layer is the value so that an emission wavelength is, for example, 380 nm to 460 nm.

The p type cladding layer 15 has a superlattice structure in which p-AlGaN and p-InGaN are alternately deposited seven times. The p-type impurity is Mg.

The p-type contact layer 16 is formed of p-GaN doped with Mg. To make a good contact with the p electrode 19, the p-type contact layer 16 may comprise multiple layers with different carrier concentrations.

Next will be described a method for producing the Group III nitride semiconductor light-emitting device according to Embodiment 1 with reference to FIG. 2.

Figure 2A:
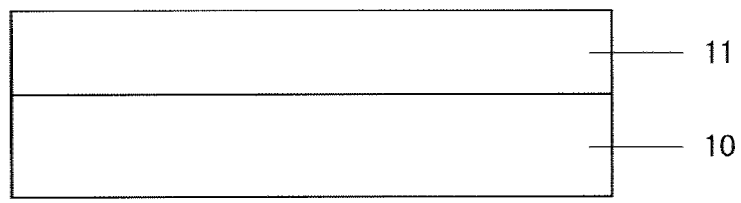
FIGS. 2A to 2D are sketches showing a process for producing a Group III nitride semiconductor light-emitting device according to Embodiment 1.

Firstly, a sapphire substrate 10 was heated in a hydrogen atmosphere for cleaning, to thereby remove deposits from the surface of the sapphire substrate 10. Thereafter, a GaN n-type contact layer 11 was formed on the sapphire substrate 10 via an AlN buffer layer (not illustrated) by the MOCVD method (FIG. 2A). The gases employed were as follows: hydrogen or nitrogen ($H_2$ or $N_2$) as a carrier gas; ammonia gas ($NH_3$) as a nitrogen source; trimethylgallium ($Ga(CH_3)_3$, hereinafter may be referred to as "TMG") as a Ga source; and silane ($SiH_4$) as an n-type dopant gas.

Figure 2B:
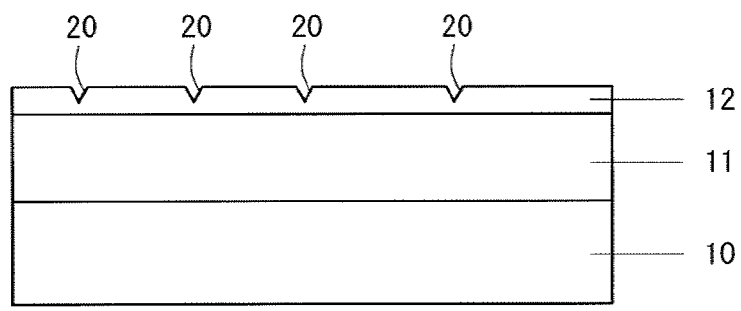

Subsequently, an ESD layer 12 was formed on the n-type contact layer 11 by the MOCVD method. The growth temperature of the ESD layer 12 was adjusted to 850° C. to 920° C. so as to form a pit 20 having a density of approx. $1 \times 10^8/cm^2$ to $5 \times 10^8/cm^2$ on the surface of the ESD layer 12 (FIG. 2B).

Figure 2C:
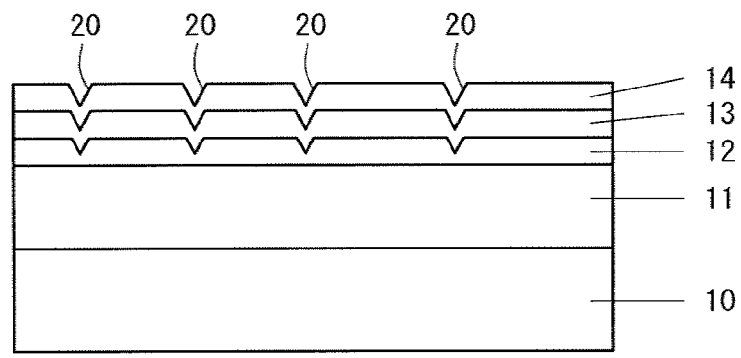

Next, an n-type cladding layer 13 and a light-emitting layer 14 were sequentially deposited on the ESD layer 12 by the MOCVD method. The same gases mentioned above were employed as a carrier gas, a nitrogen source, and a Ga source. Trimethylindium ($In(CH_3)_3$, hereinafter may be referred to as "TMI") was employed as an In source and trimethylaluminum ($Al(CH_3)_3$, hereinafter may be referred to as "TMA") was employed as an Al source. The n-type cladding layer 13 and the light-emitting layer 14 were formed without burying the pit 20 (FIG. 2C). Here, since the ESD layer 12 was formed at a temperature of 850° C. to 920° C., the pit diameter was 110 nm to 150 nm at the interface between the n-type cladding layer 13 and the light-emitting layer 14.

Figure 3:
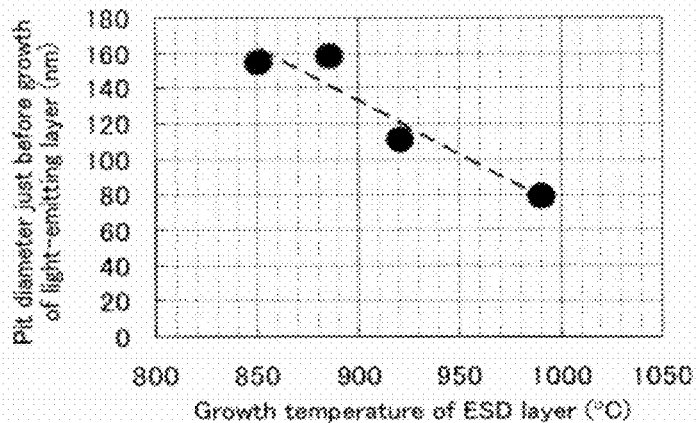
FIG. 3 is a graph showing the relationship between the growth temperature of the ESD layer 12 and the pit diameter.

FIG. 3 is a graph showing the relationship between the growth temperature of the ESD layer 12 and the pit diameter at the interface between the n-type cladding layer 13 and the light-emitting layer 14. As is clear from FIG. 3, the pit diameter can be controlled by the growth temperature of the ESD layer 12. When the growth temperature of the ESD layer 12 was adjusted to 850° C., 920° C., and 990° C., the pit diameter was 150 nm, 110 nm, and 80 nm respectively.

Figure 2D:
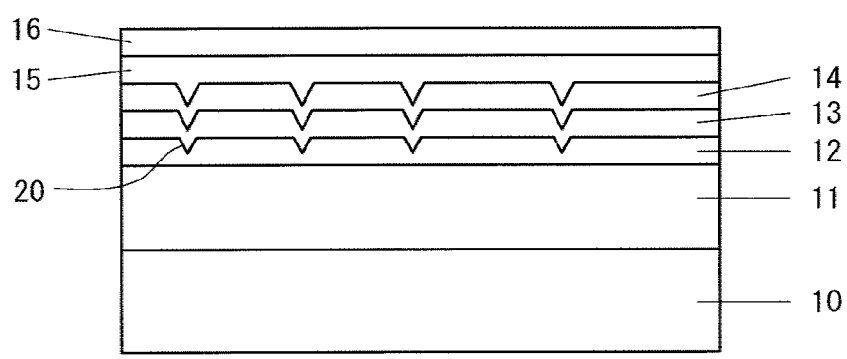

Next, a p-type cladding layer 15 and a p-type contact layer 16 were deposited on the light-emitting layer 14 (FIG. 2D). When these layers were formed, the pit 20 was buried so that the top surface was planarized. Biscyclopentadienylmagnesium (mg(C₅H₅)₂, hereinafter may be referred to as "Cp₂Mg") was employed as a p-type dopant gas.

Subsequently, Mg was activated through thermal treatment, and then dry etching was performed from the top surface of the p-type contact layer 16, to thereby form a trench reaching the n-type contact layer 11. A transparent electrode 18 was formed on the top surface of the p-type contact layer 16. Then, on the transparent electrode 18, a p electrode 19 was formed. On the surface of the n-type contact layer 11 exposed at the bottom of the trench through dry etching, an n electrode 17 was formed. Thus, the light-emitting device 1 shown in FIG. 1 was produced.

Figure 4:
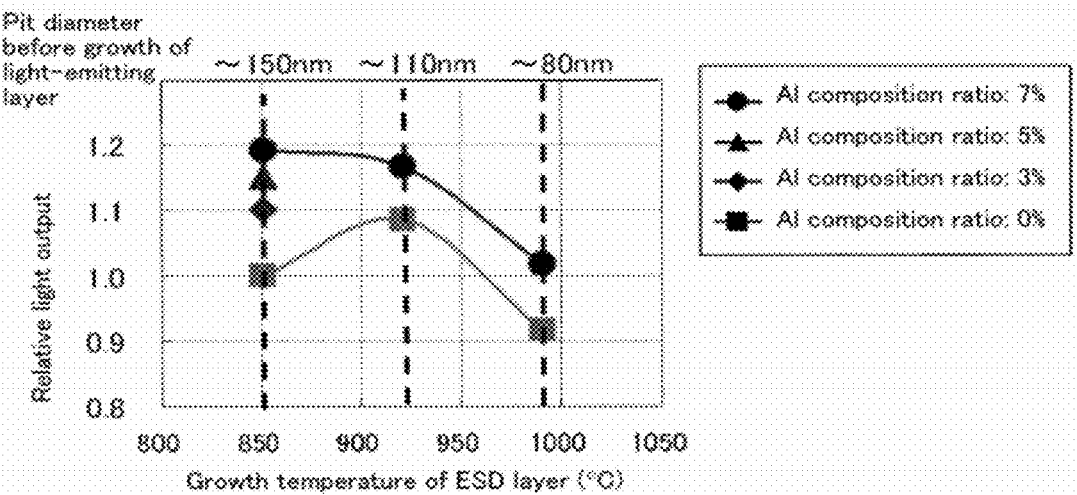
FIG. 4 is a graph showing the relationship between the growth temperature of the ESD layer 12 and the light output.
Figure 5:
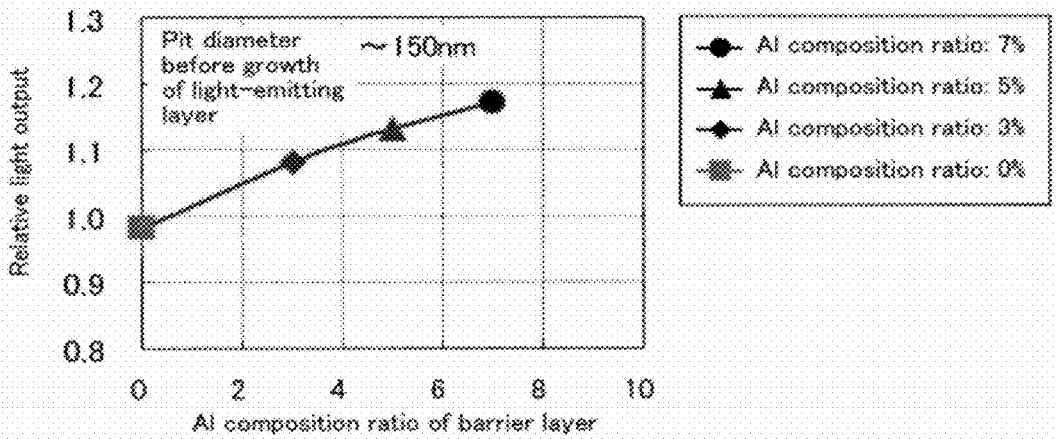
FIG. 5 is a graph showing the relationship between the Al composition ratio of the barrier layer 14A and the light output.

FIG. 4 is a graph showing the relationship between the growth temperature of the ESD layer 12 and the relative light output. FIG. 5 is a graph showing the relationship between the Al composition ratio of the barrier layer of the light-emitting layer 14 and the relative light output when the growth temperature of the ESD layer 12 is 850° C. The relative light output is a relative value to the light output when the growth temperature of the ESD layer 12 is 850° C. and the Al composition ratio is 0% (that is, the barrier layer is GaN), which is considered as 1. As is obvious from FIG. 4, when the pit diameter is excessively small by increasing the growth temperature of the ESD layer 12, the strain in the light emitting layer 14 is not sufficiently relaxed, resulting in the reduction of light output. On the other hand, when the pit diameter is excessively large by decreasing the growth temperature of the ESD layer 12, the carrier is not sufficiently confined, resulting in the reduction of relative light output. Therefore, as in the Group III nitride semiconductor light-emitting device according to Embodiment 1, it is estimated that the growth temperature of the ESD layer 12 is preferably in a range of 850° C. to 920° C., that is, the pit diameter is in a range of 110 nm to 150 nm. It is also found from FIG. 4 and FIG. 5 that the relative light output increases as the Al composition ratio of the barrier layer is increased. This is because the higher the Al composition ratio, the more the carrier is confined in the light-emitting layer 14, resulting in the reduction of overflow. As is clear from FIG. 5, about 1.1 times the light output is obtained when the Al composition ratio is 3% as compared to when the Al composition ratio is 0%. Thus, it is estimated that the Al composition ratio is preferably 3% to 7%.

The present invention has the characteristics that the n-type layer has a pit with a diameter of 110 nm to 150 nm at the interface between the n-type layer and the light-emitting layer, and that the barrier layer of the light-emitting layer is formed of AlGaN. Any conventionally known structure can be employed for the structures other than the above. For example, the present invention can be applied to the light-emitting device having a structure in which a conductive material is used as a substrate or a substrate is removed by laser lift-off, and the electrodes are formed at the top of the device and the bottom of the substrate to establish electrical conduction in a vertical direction.

The Group III nitride semiconductor light-emitting device of the present invention can be used as light sources.

What is claimed is:

1. A Group III nitride semiconductor light-emitting device comprising an n-type layer, a light-emitting layer, and a p-type layer, which are sequentially deposited, the n-type layer having a pit, wherein the pit diameter is 110 nm to 150 nm at an interface between the light-emitting layer and the n-type layer; and the light-emitting layer has a MQW structure in which an AlGaN barrier layer and an InGaN well layer are alternately deposited.

2. A Group III nitride semiconductor light-emitting device according to claim 1, wherein the barrier layer has an Al composition ratio of 3 mol % to 7 mol % to AlGa.

3. A Group III nitride semiconductor light-emitting device according to claim 1, wherein the n-type layer has a structure in which an n-type contact layer, an ESD layer, and an n-type cladding layer are deposited; the pit is formed in and from the ESD layer; and the n-type cladding layer and the light-emitting layer are formed without burying the pit.

4. A Group III nitride semiconductor light-emitting device according to claim 2, wherein the n-type layer has a structure in which an n-type contact layer, an ESD layer, and an n-type cladding layer are deposited; the pit is formed in and from the ESD layer; and the n-type cladding layer and the light-emitting layer are formed without burying the pit.

5. A method for producing a Group III nitride semiconductor light-emitting device comprising an n-type layer, a light-emitting layer, and a p-type layer, which are sequentially deposited, the n-type layer having a pit, the method comprising:
    forming the pit at a growth temperature of 850° C. to 920° C.; and
    forming the light-emitting layer by alternately depositing an AlGaN barrier layer and an InGaN well layer.

6. A method for producing a Group III nitride semiconductor light-emitting device according to claim 5, wherein the barrier layer is formed to have an Al composition ratio of 3 mol % to 7 mol % to AlGa.

7. A method for producing a Group III nitride semiconductor light-emitting device according to claim 5, wherein the n-type layer has a structure in which an n-type contact layer, an ESD layer, and an n-type cladding layer are deposited; the pit is formed in and from the ESD layer; and the n-type cladding layer and the light-emitting layer are formed without burying the pit.

8. A method for producing a Group III nitride semiconductor light-emitting device according to claim 6, wherein the n-type layer has a structure in which an n-type contact layer, an ESD layer, and an n-type cladding layer are deposited; the pit is formed in and from the ESD layer; and the n-type cladding layer and the light-emitting layer are formed without burying the pit.

* * * * *